United States Patent
Kim et al.

(10) Patent No.: US 11,908,532 B2
(45) Date of Patent: Feb. 20, 2024

(54) MEMORY DEVICE AND METHOD OF OPERATING THE MEMORY DEVICE

(71) Applicant: SK hynix Inc., Icheon-si (KR)

(72) Inventors: Jong Woo Kim, Icheon-si (KR); Young Cheol Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 164 days.

(21) Appl. No.: 17/580,274

(22) Filed: Jan. 20, 2022

(65) Prior Publication Data

US 2023/0040560 A1 Feb. 9, 2023

(30) Foreign Application Priority Data

Aug. 4, 2021 (KR) ........................ 10-2021-0102765

(51) Int. Cl.
*G11C 16/34* (2006.01)
*G11C 16/10* (2006.01)
*G11C 16/04* (2006.01)

(52) U.S. Cl.
CPC ...... *G11C 16/3459* (2013.01); *G11C 16/0483* (2013.01); *G11C 16/10* (2013.01)

(58) Field of Classification Search
CPC .. G11C 16/3459; G11C 18/0483; G11C 16/10
USPC .................................................. 365/185.22
See application file for complete search history.

(56) References Cited

U.S. PATENT DOCUMENTS

2017/0125116 A1* 5/2017 Shim ................. G11C 16/08
2020/0258585 A1* 8/2020 Lee .................... G11C 16/08

FOREIGN PATENT DOCUMENTS

KR 1020160021654 A 2/2016
KR 1020180029430 A 3/2018

* cited by examiner

*Primary Examiner* — Huan Hoang
(74) *Attorney, Agent, or Firm* — William Park & Associates Ltd.

(57) ABSTRACT

Provided herein is a memory device and a method of operating the memory device. The memory device includes a memory cell array including a plurality of memory cells, a peripheral circuit configured to perform a program operation for storing data in selected memory cells among the plurality of memory cells, and a control logic circuit configured to control the peripheral circuit to form threshold voltage distributions corresponding to target program states corresponding to the data to be stored in the selected memory cells, respectively, wherein the control logic controls the peripheral circuit to perform a main verify operation for any one of the target program states of the selected memory cells when a pre-verify operation for the any one of the target program states has passed.

20 Claims, 12 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2021-0102765, filed on Aug. 4, 2021, which is incorporated herein by reference in its entirety.

BACKGROUND

1. Technical Field

Various embodiments of the present disclosure generally relate to a storage device, and more particularly to a memory device and a method of operating the memory device.

2. Related Art

A storage device is a device which stores data under the control of a host device, such as a computer or a smartphone. The storage device may include a memory device in which data is stored and a memory controller which controls the memory device. Such memory devices are classified into a volatile memory device and a nonvolatile memory device.

The volatile memory device is a memory device in which data is stored only when power is supplied and in which stored data is lost when the supply of power is interrupted. Examples of the volatile memory device include a static random access memory (SRAM) and a dynamic random access memory (DRAM).

The nonvolatile memory device is a memory device in which stored data is retained even when the supply of power is interrupted. Examples of the nonvolatile memory device include a read only memory (ROM), a programmable ROM (PROM), an electrically programmable ROM (EPROM), an electrically erasable and programmable ROM (EEPROM), and a flash memory.

SUMMARY

An embodiment of the present disclosure may provide for a memory device. The memory device may include a memory cell array including a plurality of memory cells, a peripheral circuit configured to perform a program operation for storing data in selected memory cells among the plurality of memory cells, and a control logic circuit configured to control the peripheral circuit to form threshold voltage distributions corresponding to target program states corresponding to the data to be stored in the selected memory cells, respectively, wherein the control logic circuit may control the peripheral circuit to perform a main verify operation for any one of the target program states of the selected memory cells when a pre-verify operation for the any one of the target program states has passed.

An embodiment of the present disclosure may provide for a memory device. The memory device may include a memory cell array including a plurality of memory cells, a peripheral circuit configured to perform a program operation including a plurality of program loops for storing data in selected memory cells among the plurality of memory cells, and a control logic circuit configured to control the peripheral circuit to perform a program verify operation including a main verify operation and a pre-verify operation, the program verify operation verifying whether the selected memory cells form threshold voltage distributions corresponding to target program states corresponding to the data to be stored in the selected memory cells, respectively, wherein the control logic circuit, when the pre-verify operation for any one of the target program states of the selected memory cells in any one of the plurality of program loops has passed, controls the peripheral circuit to skip the pre-verify operation for the any one of the target program states in next program loop of the any one of the plurality of program loops.

DETAILED DESCRIPTION

Specific structural or functional descriptions in the embodiments of the present disclosure introduced in this specification or application are provided for examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device that supports an improved program operation and a method of operating the memory device.

Figure 1:
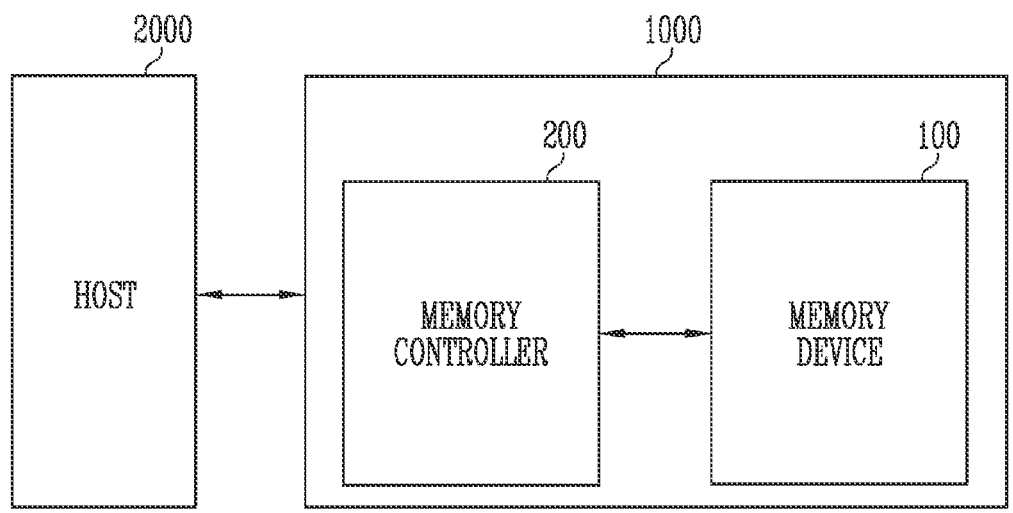
FIG. 1 is a diagram illustrating a storage device according to an embodiment of the present disclosure.

FIG. 1 is a diagram illustrating a storage device according to an embodiment of the present disclosure.

Referring to FIG. 1, a storage device 1000 may include a memory device 100 and a memory controller 200.

The storage device 1000 may be a device which stores data under the control of a host 2000, such as a mobile phone, a smartphone, an MP3 player, a laptop computer, a desktop computer, a game console, a display device, a tablet PC, or an in-vehicle infotainment system.

The storage device 1000 may be implemented as any one of various types of storage devices depending on a host interface that is a scheme for communication with the host 2000. For example, the storage device 1000 may be implemented as any one of various types of storage devices, for example, a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 1000 may be implemented in any one of various types of package forms. For example, the storage device 1000 may be implemented in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data or use the stored data. For example, the memory device 100 may be operated in response to the control of the memory controller 200, Further, the memory device 100 may include a plurality of memory dies, each of which may include a memory cell array including a plurality of memory cells which store data.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells, and one memory block may include a plurality of pages. Here, each page may be one unit by which data is stored in the memory device 100 or by which data stored in the memory device 100 is read.

The memory device 100 may be implemented as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change RAM (PRAM), a magnetoresistive RAM (MRAM), a ferroelectric RAM (FRAM), or a Spin-Transfer Torque RAM (STT-RAM). In the present specification, for convenience of description, a description will be made on the assumption that the memory device 100 is a NAND flash memory.

The memory device 100 may receive a command and an address from the memory controller 200. The memory device 100 may access an area, selected by the received address, in the memory cell array. Accessing the selected area may mean that an operation corresponding to the received command is performed on the selected area. For example, the memory device 100 may perform a write operation (i.e., a program operation), a read operation, and an erase operation. Here, the program operation may be an operation in which the memory device 100 writes data to an area selected by the address. The read operation may be an operation in which the memory device 100 reads data from an area selected by the address. The erase operation may be an operation in which the memory device 100 erases data stored in an area selected by the address.

In accordance with an embodiment of the present disclosure, the memory device 100 may skip an unnecessary verify operation during a program operation, thus reducing the time required for the program operation and increasing the efficiency of the program operation. For example, the memory device 100 may perform a double-verify operation composed of a pre-verify operation and a main verify operation to eliminate a shift or deviation in threshold voltage distributions of memory cells during the program operation. However, during a program operation (e.g., a double verify program (DPGM) operation) including a double verify operation, an unnecessary verify operation may be repeated while the double verify operation is being performed even if memory cells have passed any one of a pre-verify operation and a main verify operation.

For example, a conventional double verify operation is problematic in that, even if a pre-verify operation for a certain program state has passed, the pre-verify operation is repeatedly performed. In accordance with an embodiment of the present disclosure, the memory device 100 may skip an unnecessary verify operation while maintaining the effect of eliminating a shift or deviation in threshold voltage distributions, which is the advantage of the double verify operation, thus shortening the time required for the program operation.

The memory controller 200 may control the overall operation of the storage device 1000. For example, when power is applied to the storage device 1000, the memory controller 200 may run firmware (FW). The firmware (FW) may include a host interface layer (HIL) which receives a request input from the host 2000 or outputs a response to the host 2000, a flash translation layer (FTL) which manages an operation between the interface of the host 2000 and the interface of the memory device 100, and a flash interface layer (FIL) which provides a command to the memory device 100 or receives a response from the memory device 100.

The memory controller 200 may receive data and a logical address (LA) from the host 2000, and may translate the logical address into a physical address (PA) indicating the address of memory cells which are included in the memory device 100 and in which data is to be stored. The logical address may be a logical block address (LBA), and the physical address may be a physical block address (PBA).

The memory controller 200 may control the memory device 100 so that a program operation, a read operation or an erase operation is performed in response to a request received from the host 2000. During a program operation, the memory controller 200 may provide a program command, a physical block address, and data to the memory device 100. During a read operation, the memory controller 200 may provide a read command and a physical block address to the memory device 100. During an erase operation, the memory controller 200 may provide an erase command and a physical block address to the memory device 100.

The memory controller 200 may control the memory device 100 so that a program operation, a read operation or an erase operation is autonomously performed regardless of a request received from the host 2000. For example, the memory controller 200 may control the memory device 100 so that a program operation, a read operation or an erase operation to be used to perform background operations, such as wear leveling, garbage collection, and read reclaim operations, is performed.

The host 2000 may communicate with the storage device 1000 using at least one of various communication methods such as universal serial bus (USB), Serial AT Attachment (SATA), Serial Attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIN1M), and load reduced DIMM (LRDIMM) communication methods.

Figure 2:
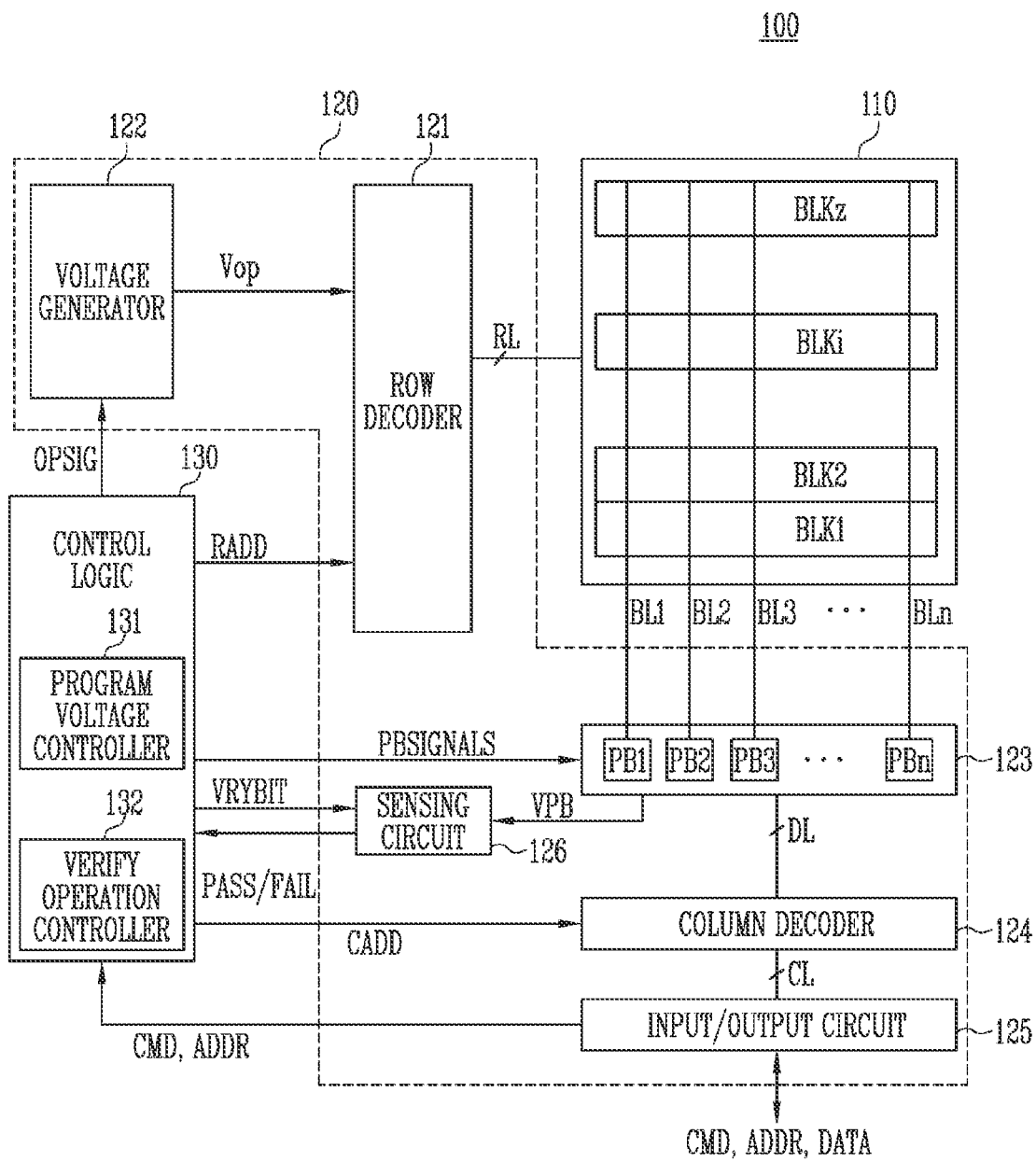
FIG. 2 is a diagram illustrating a memory device according to an embodiment of the present disclosure.

FIG. 2 is a block diagram illustrating a memory device according to an embodiment of the present disclosure.

Referring to FIG. 2, a memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 may include a plurality of memory blocks BLK1 to BLKz. The plurality of memory blocks BLK1 to BLKz may be coupled to a row decoder 121 through row lines RL. Here, the row lines RL may include at least one source select line, a plurality of word lines, and at least one drain select line, Each of the memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as a single page. Therefore, a single memory block may include a plurality of pages.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The peripheral circuit 120 may perform a program operation, a read operation, or an erase operation on a selected area of the memory cell array 110 under the control of the control logic 130. That is, the peripheral circuit 120 may drive the memory cell array 110 under the control of the control logic 130. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 may be coupled to the memory cell array 110 through the row lines RL, The row lines RL may include the at least one source select line, the plurality of word lines, and the at least one drain select line. In an embodiment, the word lines may include normal word lines and dummy word lines. Further, the row lines RL may further include a pipe select line.

The row decoder 121 may be operated in response to control of the control logic 130. The row decoder 121 may receive a row address RADD from the control logic 130. For example, the row decoder 121 may decode the row address RADD. The row decoder 121 may select at least one of the memory blocks BLK1 to BLKz according to the decoded address. Further, the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory cell array 110 may be performed on a memory block basis, During an erase operation, the row decoder 121 may select one memory block according to the decoded address, and may apply a ground voltage to word lines coupled to the selected memory block.

The voltage generator 122 may be operated under the control of the control logic 130. More specifically, the voltage generator 122 may generate a plurality of voltages using an external supply voltage supplied to the memory device 100 under the control of the control logic 130. For example, the voltage generator 122 may generate a program voltage, a verify voltage, a pass voltages, a read voltage, an erase voltage, etc. under the control of the control logic 130. That is, the voltage generator 122 may generate various operating voltages Vop that are used for program, read, and erase operations in response to an operation signal OPSIG. In accordance with an embodiment of the present disclosure, the voltage generator 122 may generate not only the program voltage that is used for a program operation but also a pre-verify voltage that is used for a pre-verify operation and a main verify voltage that is used for a main verify operation, under the control of the control logic 130.

In an embodiment, the voltage generator 122 may generate an internal supply voltage by regulating the external supply voltage. The internal supply voltage generated by the voltage generator 122 may be used as an operating voltage for the memory cell array 110.

In an embodiment, the voltage generator 122 may generate a plurality of voltages using the external supply voltage or the internal supply voltage. For example, the voltage generator 122 may include a plurality of pumping capacitors for receiving the internal supply voltage, and may generate a plurality of voltages by selectively enabling the plurality of pumping capacitors under the control of the control logic 130, Also, the plurality of generated voltages may be supplied to the memory cell array 110 by the row decoder 121.

The page buffer group 123 may include first to nth page buffers PB1 to PBn. The first to nth page buffers PB1 to PBn may be coupled to the memory cell array 110 through the first to n-th bit lines BL1 to BLn, respectively. Further, the first to n-th page buffers PB1 to PBn may be operated under the control of the control logic 130. For example, the first to n-th page buffers PB1 to PBn may be operated in response to page buffer control signals PBSIGNALS. For example, the first to n-th page buffers PB1 to PBn may temporarily store data received through the first to nth bit lines BL1 to BLn or may sense voltages or currents of the bit lines BL1 to BLn during a read or verify operation.

For example, during a program operation, when a program pulse is applied to a selected word line, the first to n-th page buffers PB1 to PBn may transfer data DATA, received through the input/output circuit 125, to selected memory cells through the first to n-th bit lines BL1 to BLn. The memory cells in the selected page may be programmed based on the received data DATA. Memory cells coupled to a bit line to which a program enable voltage (e.g., a ground voltage) is applied may have increased threshold voltages. The threshold voltages of memory cells coupled to a bit line to which a program inhibit voltage (for example, a supply voltage) is applied may be maintained.

During a program verify operation, the first to n-th page buffers PB1 to PBn may read page data from the selected memory cells through the first to nth bit lines BL1 to BLn.

During a read operation, the first to n-th page buffers PB1 to PBn may read data DATA from the memory cells in the selected page through the first to nth bit lines BL1 to BLn, and may output the read data DATA to the input/output circuit 125 uncle the control of the column decoder 124.

During an erase operation, the first to nth page buffers PB1 to PBn may allow the first to nth bit lines BL1 to BLn to float.

The column decoder 124 may transfer data between the input/output circuit 125 and the page buffer group 123 in response to a column address CADD. For example, the column decoder 124 may exchange data with the first to n-th page buffers PB1 to PBn through data lines DL or may exchange data with the input/output circuit 125 through column lines CL.

The input/output circuit 125 may transfer a command CMD and an address ADDR, received from the memory controller 200, to the control logic 130, or may exchange the data DATA with the column decoder 124.

During a read operation or a verify operation, the sensing circuit 126 may generate a reference current in response to an enable bit signal VRYBIT, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation signal OPSIG, the row address RADD, the page buffer control signals PBSIGNALS, and the enable bit VRYBIT in response to the command CMD and the address ADDR.

Further, the control logic 130 may determine whether the verify operation has passed or failed in response to the pass or fail signal PASS or FAIL. Also, the control logic 130 may control the page buffer group 123 so that verify information including the pass or fail signal PASS or FAIL is temporarily stored in the page buffer group 123. For example, the control logic 130 may determine the program state of each memory cell in response to the pass or fail signal PASS or FAIL. For example, when the memory cell is operated as a triple-level cell (TLC), the control logic 130 may determine whether the program state of the memory cell is an erased state E or any one of first to seventh program states P1 to P7.

In accordance with an embodiment of the present disclosure, the control logic 130 may include a program voltage controller 131 and a verify operation controller 132. The program voltage controller 131 may control the peripheral circuit 120 so that memory cells selected from among the plurality of memory cells form target program states respectively corresponding to the selected memory cells. For example, the program voltage controller 131 may control the peripheral circuit 120 so that the program voltage is applied to a word line coupled to the selected memory cells on which the program operation is performed. Also, the verify operation controller 132 may control the peripheral circuit 120 so that the verify operation is performed on the selected memory cells on which the program operation is performed. For example, the verify operation controller 132 may control the peripheral circuit 120 so that the main verify voltage and the pre-verify voltage are applied to the word line coupled to the selected memory cells.

Figure 3:
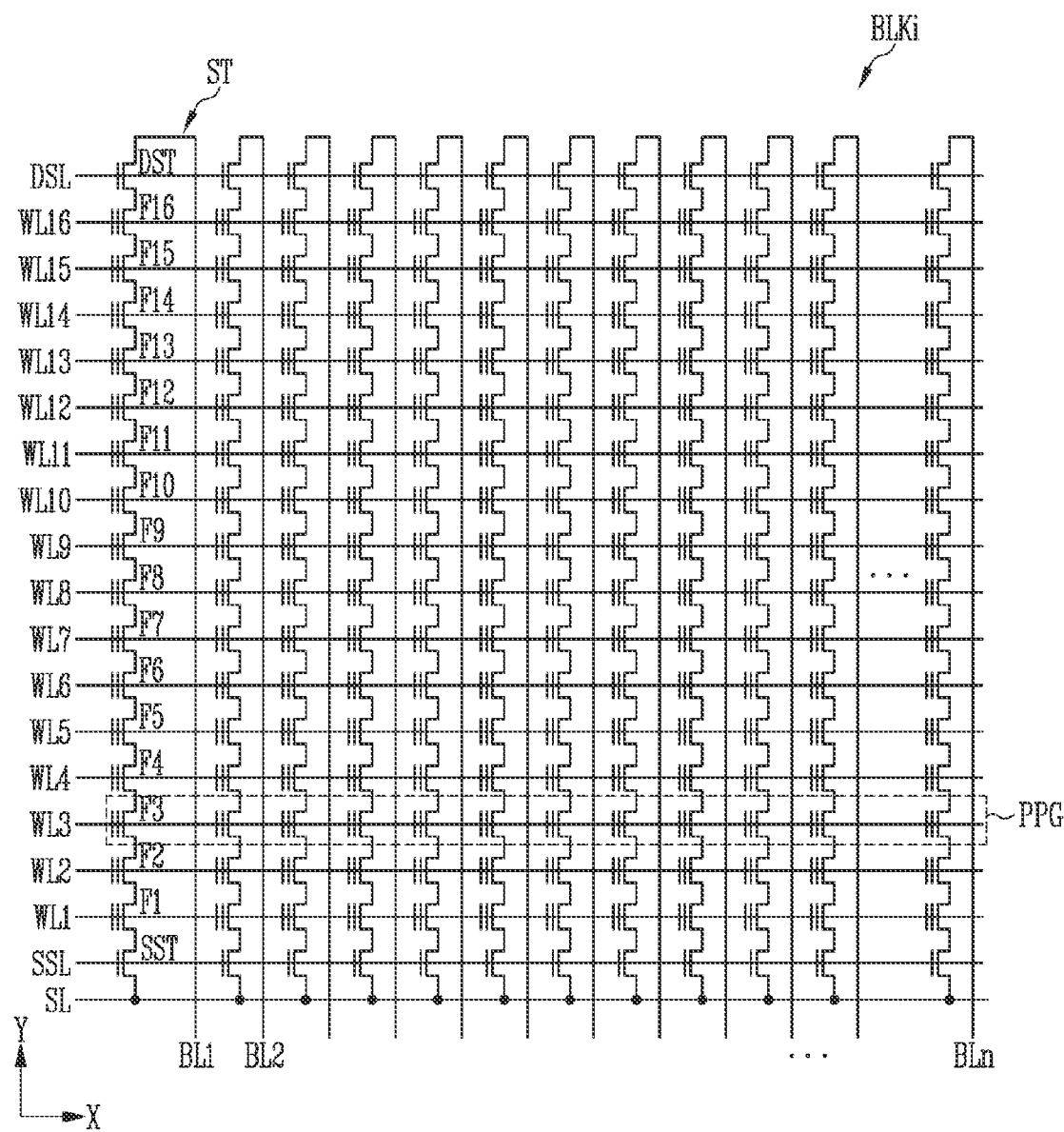
FIG. 3 is a diagram illustrating a memory block according to an embodiment of the present disclosure.

FIG. 3 is a diagram illustrating a memory block according to an embodiment of the present disclosure.

Referring to FIG. 3, a plurality of word lines arranged in parallel to each other between a first select line and a second select line may be coupled to a memory block BLKi, Here, the first select line may be a source select line SSL, and the second select line may be a drain select line DSL, For example, the memory block BLKi may include a plurality of strings ST coupled between bit lines BL1 to BLn and a source line SL. The bit lines BL1 to BLn may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1, A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST, Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively, A group of memory cells coupled to the same word line, among the memory cells included in different strings ST, may be referred to as a 'physical page (PPG)', Therefore, the memory block BLKi may include a number of physical pages (PPG) identical to the number of word lines WL1 to WL16.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

A single-level cell (SLC) may store 1 bit of data. One physical page (PPG) for single-level cells may store data corresponding to one logical page (LPG). The data corresponding to one logical page (LPG) may include a number of data bits identical to the number of cells included in one physical page (PPG).

A multi-level cell (MLC), a triple-level cell (TLC), and a quad-level cell (QLC) may store two or more bits of data. Here, one physical page (PPG) may store data corresponding to two or more logical pages (LPG), FIG. 4 is a diagram illustrating a program operation according to an embodiment of the present disclosure.

Figure 4:
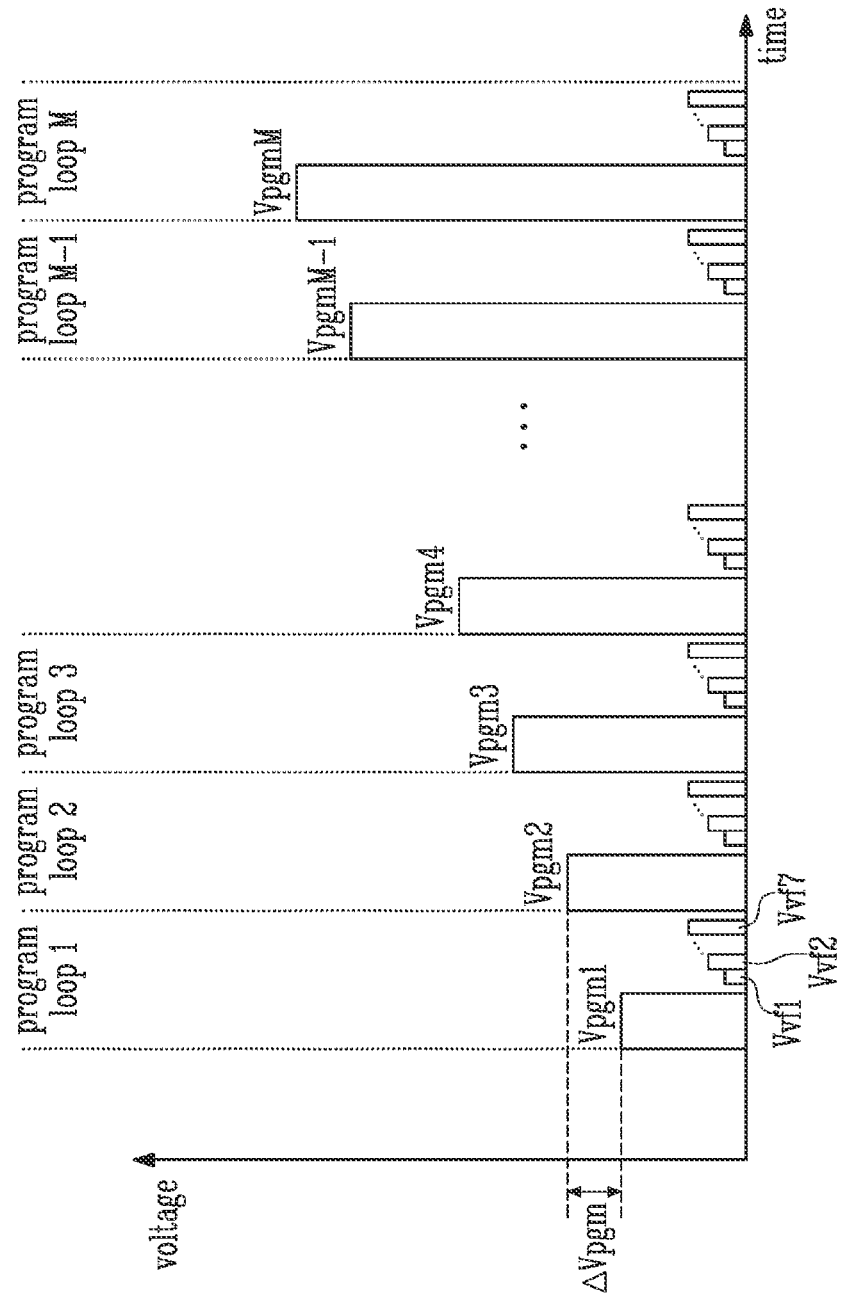
FIG. 4 is a diagram illustrating a program operation according to an embodiment of the present disclosure.

Referring to FIG. 4, a program operation of forming a plurality of program states may include M program loops, Each program loop may include an operation of applying a program voltage to a selected word line and an operation of applying a verify voltage to the selected word line. The operation of applying the program voltage may be included in a program period, and the operation of applying the verify voltage nay be included in a verify period. The operation of applying the program voltage to the selected word line may be an operation of increasing the threshold voltage of a memory cell, and the operation of applying the verify voltage may be an operation of determining the threshold voltage and verifying whether the corresponding memory cell has reached a target program state. For example, a first program loop may include an operation of applying a first program voltage Vpgm1 and a plurality of verify voltages Vvf1 to Vvf7 to the selected word line. Although seven verify voltages are illustrated as being applied in all program loops for convenience of description, the number of verify voltages is not limited thereto, and different number of verify voltages may be applied.

As each program loop is sequentially performed, the program voltage may be increased by a step voltage ΔVpgm. This scheme is referred to as an incremental step pulse programming (SPP) scheme. For example, a second program voltage Vpgm2 applied to a selected word line in a second program loop may be higher than the first program voltage Vpgm1 by the step voltage ΔVpgm, Although the step voltage is illustrated as being fixed for convenience of description, it may be dynamically changed.

Each memory cell having reached a target program state during the performance of M program loops may be program-inhibited so that the memory cell is not programmed any further, Even if a subsequent program loop is performed, the threshold voltage of the memory cell which has been program-inhibited may be maintained. For example, a memory cell that has been programmed to the second program state P2, which is the target program state, in the second program loop may be program-inhibited in a third program loop. In an embodiment, the bit line of the memory cell having reached the target program state may be precharged to a program inhibit voltage. When the bit line is precharged to the program inhibit voltage, the channel of the memory cell may be self-boosted due to the program voltage, and the memory cell may not be programmed, FIG. 5 is a diagram illustrating program loops according to an embodiment of the present disclosure.

Figure 5:
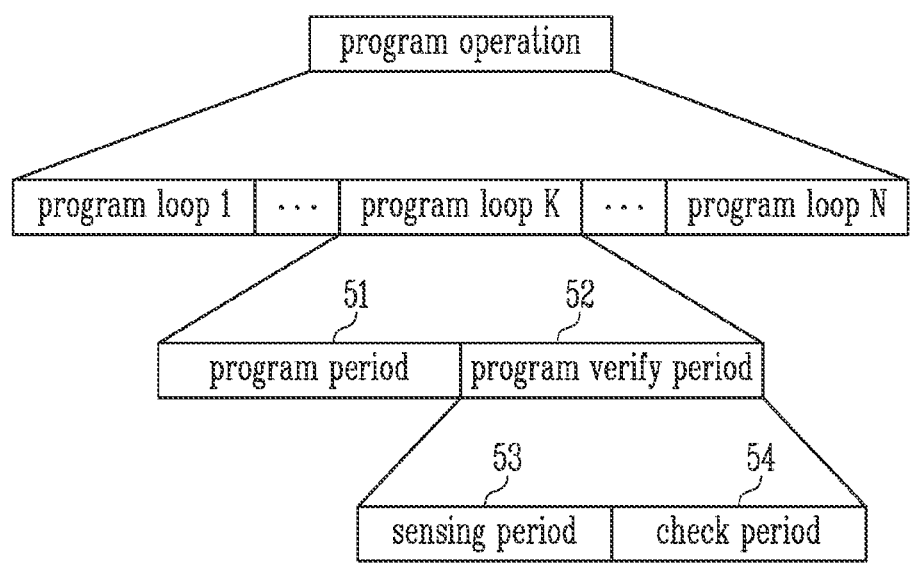
FIG. 5 is a diagram illustrating program loops according to an embodiment of the present disclosure.

Referring to FIG. 5, a program operation composed of N program loops is illustrated. For example, the program operation may include a first program loop (program loop 1) to an N-th program loop (program loop N). Among a plurality of memory cells, selected memory cells that are the target of the program operation may be programmed to target program states through the program operation. A plurality of program states may be divided based on threshold voltages. For example, when each of the selected memory cells is operated as a single-level cell (SLC), the target program states may be divided into an erased state and a program state. When each of the selected memory cells is operated as a mufti-level cell (MLC), the target program states may be divided into one erased state and seven program states.

Each program loop may include a program period 51 and a program verify period 52. The program period 51 may be a period during which data is programmed to selected memory cells. The program period 51 may include a precharge period, a program voltage apply period, and a discharge period. During the precharge period, a program enable voltage is precharged in a selected bit line, and a program inhibit voltage may be precharged in an unselected bit line. During the program voltage apply period, a program voltage may be applied to a selected word line, and a pass voltage may be applied to an unselected word line. During the discharge period, the voltages precharged in the bit lines and the voltages applied to the word lines may be discharged. That is, the program period 51 may be a period during which the program states of the selected memory cells become target program states.

The program verify period 52 may be a period during which programmed data is verified. Alternatively, the program verify period 52 may be a period during which it is verified whether the program states or threshold voltages of the selected memory cells have reached the target program states after the program period 51.

For example, the program verify period 52 may include a sensing period 53 and a check period 54. Also, the sensing period 53 may include a precharge period, an evaluation period, and a discharge period. During the precharge period, the bit lines may be precharged. During the evaluation period, a verify voltage may be applied to a selected word line, and a pass voltage may be applied to an unselected word line. During the evaluation period, the voltage that is precharged in a bit line coupled to a memory cell having a threshold voltage higher than the verify voltage may be maintained. During the evaluation period, the voltage that is precharged in a bit line coupled to a memory cell having a threshold voltage lower than the verify voltage may be discharged in proportion to the length of the evaluation period. Voltage information indicating whether the precharged voltage has been maintained or discharged may be stored in the page buffer group 123.

The check period 54 may be a period during which it is determined whether program verification has passed or failed using the voltage information stored in the page buffer group 123, During the check period, the sensing circuit 126 may compare the number of memory cells having threshold voltages lower than the verify voltage, among the selected memory cells, with the reference number of memory cells. Further, the sensing circuit 126 may output a pass signal or a fail signal based on the result of the comparison. Here, the determination of whether the number of memory cells having threshold voltages higher than the verify voltage, among the selected memory cells, is greater than the first reference number of memory cells may be a pass bit check operation. The determination of whether the number of memory cells having threshold voltages lower than the verify voltage, among the selected memory cells, is less than the second reference number of memory cells, may be a fail bit check operation.

Figure 6:
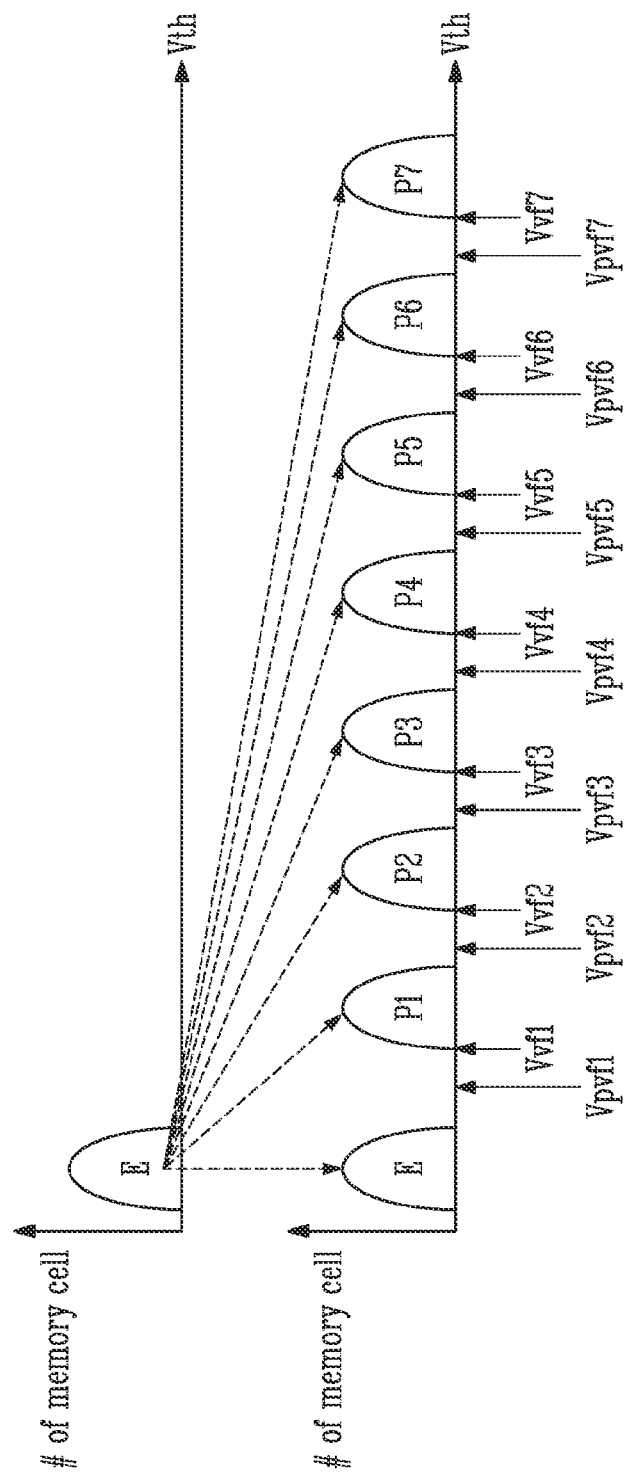
FIG. 6 is a diagram illustrating the program states of memory cells according to an embodiment of the present disclosure.

FIG. 6 is a diagram illustrating program states of memory cells according to an embodiment of the present disclosure.

Referring to FIG. 6, each memory cell may be programmed to an erased state E or one of first to seventh program states P1 to P7 depending on the threshold voltage of the memory cell. Although the memory cell of FIG. 6 are illustrated as being a triple-level cell (TLC) which can be programmed to one erased state or one of seven program states, this is only an embodiment implemented for convenience of description, and the memory cell may be implemented as a multi-level cell (MLC), a single-level cell (SLC), a quad-level cell (QLC), or the like. For convenience of description, although the erased state is separated from the program states, the erased state may be represented by a 0-th program state P0. Therefore, the erased state E and the first to seventh program states P1 to P7 illustrated in FIG. 6 may be represented by the 0-th to seventh program states.

Each of selected memory cells may have a threshold voltage included in the erased state E or any one of the first to seventh program states P1 to P7. That is, each of the memory cells may be programmed to have a threshold voltage included in the erased state E or any one of the first to seventh program states P1 to P7, Before the program operation is performed, each memory cell may be in the erased state E. During a program operation, the memory cell in the erased state E may be programmed to any one of the seven program states when a program voltage is applied to a selected word line.

Also, the erased state E or the first to seventh program states P1 to P7 of memory cells may be distinguished from each other using verify voltages. Here, the verify voltages may be divided into a main verify voltage and a pre-verify voltage. The pre-verify voltage may be a voltage that is applied before the main verify voltage is applied to the selected word line and that has a potential level lower than that of the main verify voltage.

Further, the adjacent program states of memory cells may be distinguished from each other using main verify voltages and pre-verify voltages. For example, the erased state E and the first program state P1 may be distinguished from each other using a first pre-verify voltage Vpvf1 and a first main verify voltage Vvf1. The first program state P1 and the second program state P2 may be distinguished from each other using a second pre-verify voltage Vpvf2 and a second main verify voltage Vvf2. The second program state P2 and the third program state P3 may be distinguished from each other using a third pre-verify voltage Vpvf3 and a third main verify voltage Vvf3, The third program state P3 and the fourth program state P4 may be distinguished from each other using a fourth pre-verify voltage Vpvf4 and a fourth main verify voltage Vvf4. The fourth program state P4 and the fifth program state P5 may be distinguished from each other using a fifth pre-verify voltage Vpvf5 and a fifth main verify voltage Vvf5. The fifth program state P5 and the sixth program state P6 may be distinguished from each other using a sixth pre-verify voltage Vpvf6 and a sixth main verify voltage Vvf6, The sixth program state P6 and the seventh program state P7 may be distinguished from each other using a seventh pre-verify voltage Vpvf7 and a seventh main verify voltage Vvf7.

The program operation method illustrated in FIG. 6 may form the first to seventh program states P1 to P7 from one erased state E. The program states illustrated in FIG. 6 may be formed while the program operation including first to M-th program loops illustrated in FIG. 4 is performed.

Figure 7:
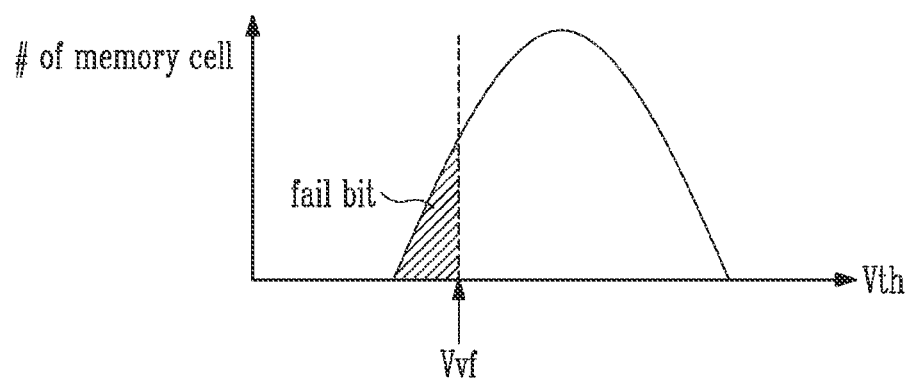
FIG. 7 is a diagram illustrating a fail bit check operation for a certain program state according to an embodiment of the present disclosure.

FIG. 7 is a diagram illustrating a fail bit check operation for a certain program state according to an embodiment of the present disclosure.

Referring to FIG. 7, the memory device 100 may perform the fail bit check operation using the sensing circuit 126. Here, the fail bit check operation may be an operation performed in the check period 54 illustrated in FIG. 5.

The fail bit check operation may be an operation of checking whether the number of fail bits, indicating the number of memory cells having threshold voltages lower than a verify voltage Vvf, is less than the reference number of fail bits. The memory device 100 may output a pass signal PASS to the control logic 130 when the number of fail bits is less than or equal to the reference number of fail bits in the fail bit check operation performed by the sensing circuit 126. The memory device 100 may output a fail signal FAIL to the control logic 130 when the number of fail bits is greater than the reference number of fail bits in the fail bit check operation performed by the sensing circuit 126.

In accordance with an embodiment of the present disclosure, during the pre-verify operation, when the number of memory cells having threshold voltages lower than a pre-verify voltage is greater than the reference number of memory cells, the corresponding pre-verify operation may be determined to have failed. In contrast, during the pre-verify operation, when the number of memory cells having threshold voltages lower than the pre-verify voltage is less than or equal to the reference number of memory cells, the corresponding pre-verify operation may be determined to have passed.

In accordance with an embodiment of the present disclosure, during a main verify operation, when the number of memory cells having threshold voltages lower than a main verify voltage is greater than the reference number of memory cells, the corresponding main verify operation may be determined to have failed. Further, during the main verify operation, when the number of memory cells having threshold voltages lower than the main verify voltage is less than or equal to the reference number of memory cells, the corresponding main verify operation may be determined to have passed.

Meanwhile, program verification for an n-th program state may be completed when the fail bit check operation using the main verify voltage has passed. That is, when the number of fail bits, indicating the number of memory cells having threshold voltages lower than an n-th main verify voltage, is less than or equal to the reference number of memory cells, program verification for the n-th program state may be completed. However; in an embodiment, when the program verify operation including a pre-verify operation and a main verify operation is performed in all program loops, the time required for the program operation may be increased. Therefore, in an embodiment, when a fail bit check operation has passed while a pre-verify operation is being performed (i.e., when the pre-verify operation has passed) during a verify operation for a specific program state, the pre-verify operation for the specific program state is skipped in a subsequent program loop, and only a main verify operation is performed, thus shortening the time required for the program operation. Alternatively, according to an embodiment of the present disclosure, a main verify operation is performed when the pre-verify operation for the specific program state has passed, thus shortening the time required for the program operation.

Figure 8:
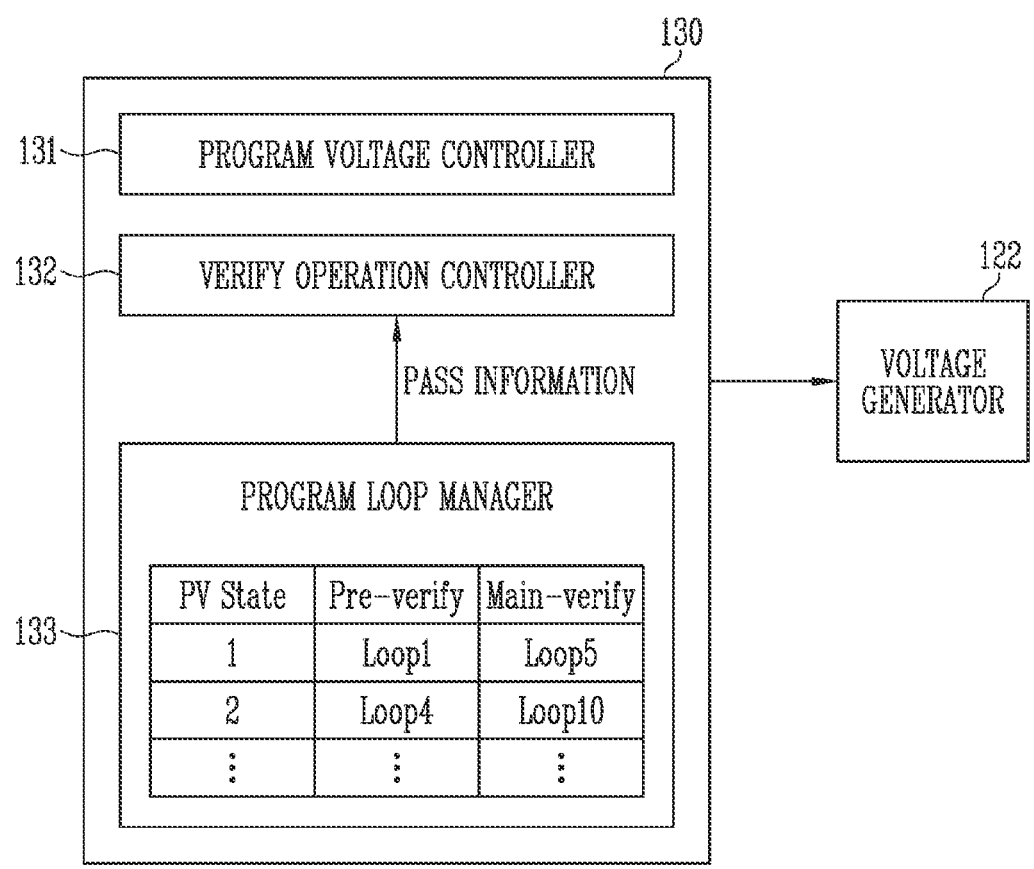
FIG. 8 is a diagram illustrating a control logic according to an embodiment of the present disclosure.

FIG. 8 is a diagram illustrating a control logic according to an embodiment of the present disclosure.

Referring to FIG. 8, the control logic 130 may include a program voltage controller 131, a verify operation controller 132, and a program loop manager 133, and may control the peripheral circuit 120 so that target program states respectively corresponding to selected memory cells are formed.

The program voltage controller 131 may control the peripheral circuit 120 so that a program voltage is applied to a word line coupled to selected memory cells. The program voltage controller 131 may control the peripheral circuit 120 so that, as each program loop is sequentially performed, the program voltage is increased by a step voltage ΔVpgm.

The verify operation controller 132 may control the peripheral circuit 120 so that a verify operation is performed on the programmed memory cells. For example, the verify operation controller 132 may control the peripheral circuit 120 so that a pre-verify operation and a main verify operation are performed on the programmed memory cells. In particular, the verify operation controller 132 may control the peripheral circuit 120 so that the main verify operation is performed or the pre-verify operation is not performed based on pass information received from the program loop manager 133.

In accordance with an embodiment of the present disclosure, the verify operation controller 132 may control the peripheral circuit 120 so that both a pre-verify operation and a main verify operation for a specific program state are performed. Further, when the pre-verify operation has passed during the verify operation for the specific program state, the verify operation controller 132 may control the peripheral circuit 120 so that only the main verify operation for the specific program state is performed.

In accordance with an embodiment of the present disclosure, the verify operation controller 132 may control the peripheral circuit 120 so that only the pre-verify operation for the specific program state is performed, and so that, when the pre-verify operation for the specific program state has passed, the main verify operation is performed. That is, in an embodiment, the verify operation controller 132 may control the peripheral circuit 120 so that only a verify operation corresponding to any one of the main verify operation and the pre-verify operation is performed, thus increasing the efficiency of the program operation.

In accordance with an embodiment, the verify operation controller 132 may control the peripheral circuit 120 so that a main verify voltage and a pre-verify voltage are applied to the word line coupled to memory cells to be verified.

The program loop manager 133 may generate pass information indicating whether pre-verify operations and main verify operations for a plurality of program states have passed. For example, the program loop manager 133 may store program loops in which pre-verify operations and main verify operations for the plurality of program states, respectively, have passed during the program operation. That is, the pass information may include pre-pass information including the time point at which the pre-verify operation for each program state has passed and main pass information including the time point at which the main verify operation for each program state has passed.

Figure 9:
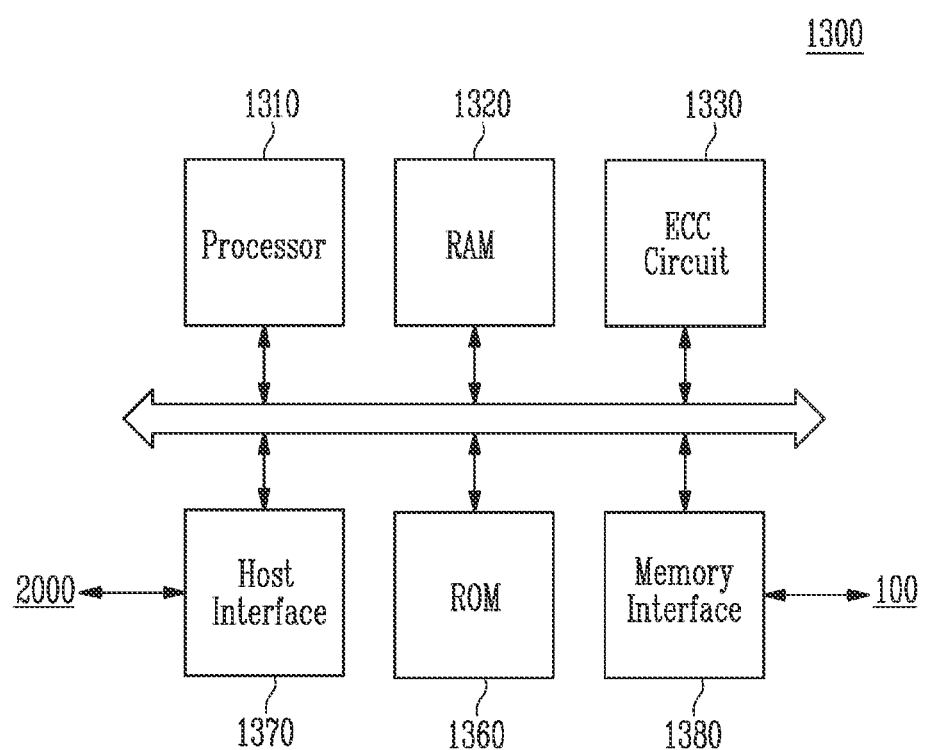
FIG. 9 is a diagram illustrating a memory controller according to an embodiment of the present disclosure.

The pre-pass information and the main pass information generated by the program loop manager 133 may be transmitted to the verify operation controller 132, and the verify operation controller 132 may control the peripheral circuit 120 so that the verify operation is performed based on the pre-pass information and the main pass information received from the program loop manager 133, For example, when pass information, indicating that the time point at which a pre-verify operation (i.e., Pre-verify) for a first program state P1 has passed is a first program loop (i.e., Loop1) and that the time point at which a main verify operation (i.e., Main-verify) for the first program state P1 (i.e., PV State: 1) has passed is a fifth program loop (i.e. Loop5), is received from the program loop manager 133, the verify operation controller 132 may control the peripheral circuit 120 so that the main verify voltage is applied from the second program loop, FIG. 9 is a diagram illustrating a memory controller according to an embodiment of the present disclosure.

Referring to FIG. 9, a memory controller 1300 may include a processor 1310, a RAM 1320, an error correction circuit (ECC circuit) 1330, a ROM 1360, a host interface 1370, and a memory interface 1380. The memory controller 1300 illustrated in FIG. 9 may be an embodiment of the memory controller 200 illustrated in FIG. 1.

The processor 1310 may communicate with the host 2000 using the host interface 1370, and may perform a logical operation to control the operation of the memory controller 1300. For example, in response to requests received from a host 2000 or an external device, the processor 1310 may load a program command, a data file, a data structure, etc., and may perform various types of operations or generate commands and addresses. For example, the processor 1310 may generate various commands required for a program operation, a read operation, an erase operation, a suspend operation, and a parameter setting operation.

Also, the processor 1310 may perform a function of a flash translation layer (FTL). The processor 1310 may translate a logical block address (LBA), provided by the host 2000, into a physical block address (PBA) through the FTL. The FTL may receive the LBA and translate the LBA into the PBA using a mapping table. Examples of an address mapping method performed through the FTL may include various methods according to a mapping unit. Representative address mapping methods include a page mapping method, a block mapping method, and a hybrid mapping method.

Further, the processor 1310 may generate commands without receiving a request from the host 2000. For example, the processor 1310 may generate commands for background operations such as operations for wear leveling of the memory device 100 and operations for garbage collection of the memory device 100.

The RAM 1320 may be used as a buffer memory, a working memory or a cache memory of the processor 1310. The RAM 1320 may store codes and commands that are executed by the processor 1310. The RAM 1320 may store data that is processed by the processor 1310, Further, in implementation of the RAM 1320, the RAM 1320 may be implemented to include a static RAM (SRAM) or a dynamic RAM (DRAM).

The error correction circuit 1330 may detect errors and correct the detected errors during a program operation or a read operation. For example, the error correction circuit 1330 may perform an error correction operation based on error correction code (ECC). Also, the error correction circuit 1330 may perform error correction encoding (ECC encoding) based on data to be written to the memory device 100. The ECC-encoded data may be transferred to the memory device 100 through the memory interface 1380. Further, the error correction circuit 1330 may perform error correction decoding (ECC decoding) on data received from the memory device 100 through the memory interface 1380.

The ROM 1360 may be used as a storage unit which stores various types of information required for the operation of the memory controller 1300. For example, the ROM 1360 may include a map table, in which physical-logical address information and logical-physical address information may be stored. Further, the ROM 1360 may be controlled by the processor 1310.

The host interface 1370 may include a protocol for performing data exchange between the host 2000 and the memory controller 1300. In an embodiment, the host interface 1370 may communicate with the host 2000 through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1380 may communicate with the memory device 100 using a communication protocol under the control of the processor 1310. For example, the memory interface 1380 may transmit/receive commands, addresses, and data to/from the memory device 100 through a channel. For example, the memory interface 1380 may include a NAND interface.

Figure 10:
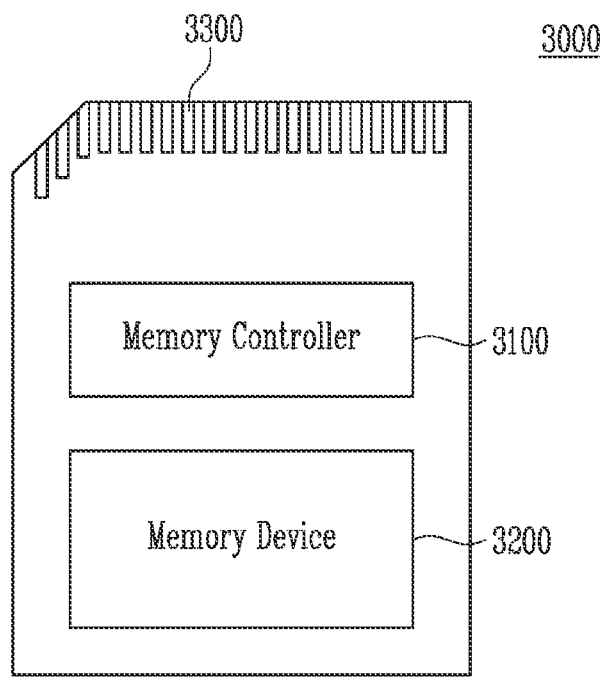
FIG. 10 is a diagram illustrating a memory card system according to an embodiment of the present disclosure.

FIG. 10 is a diagram illustrating a memory card system according to an embodiment of the present disclosure.

Referring to FIG. 10, a memory card system 3000 may include a memory controller 3100, a memory device 3200, and a connector 3300.

The memory controller 3100 may be electrically coupled to the memory device 3200, and may access the memory device 3200. For example, the memory controller 3100 may control read, write, erase, and background operations of the memory device 3200. The memory controller 3100 may provide an interface between the memory device 3200 and a host. Also, the memory controller 3100 may run firmware for controlling the memory device 3200.

For example, the memory controller 3100 may include components, such as a RAM, a processing unit, a host interface, a memory interface, and an error correction circuit.

The memory controller 3100 may communicate with an external device through the connector 3300. The memory controller 3100 may communicate with an external device (e.g., a host) based on a specific communication protocol. In an embodiment, the memory controller 3100 may communicate with the external device through at least one of various communication protocols such as universal serial bus (USB), multimedia card (MMC), embedded MMC (eMMC), peripheral component interconnection (PCI), PCI-express (PCI-E), an advanced technology attachment (ATA) protocol, a serial-ATA (SATA), parallel-ATA (DATA), small computer system interface (SCSI), enhanced small disk interface (ESDI), integrated drive electronics (IDE), Firewire, universal flash storage (UFS), WiFi, Bluetooth, and nonvolatile memory express (NVMe) protocols. In an embodiment, the connector 3300 may be defined by at least one of the above-described various communication protocols.

In an embodiment, the memory device 3200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin-Transfer Torque Magnetic RAM (STT-MRAM).

The memory controller 3100 and the memory device 3200 may be integrated into a single semiconductor device to form a memory card. For example, the memory controller 3100 and the memory device 3200 may be integrated into a single semiconductor device, and may then form a memory card such as a PC card (i.e., personal computer memory card international association: PCMCIA), a compact flash card (CF), a smart media card (SM or SMC), a memory stick, a multimedia card (MMC, RS-MMC, micro-MMC or eMMC), a SD card (SD, miniSD, microSD, or SDHC), or a universal flash storage (UFS).

Figure 11:
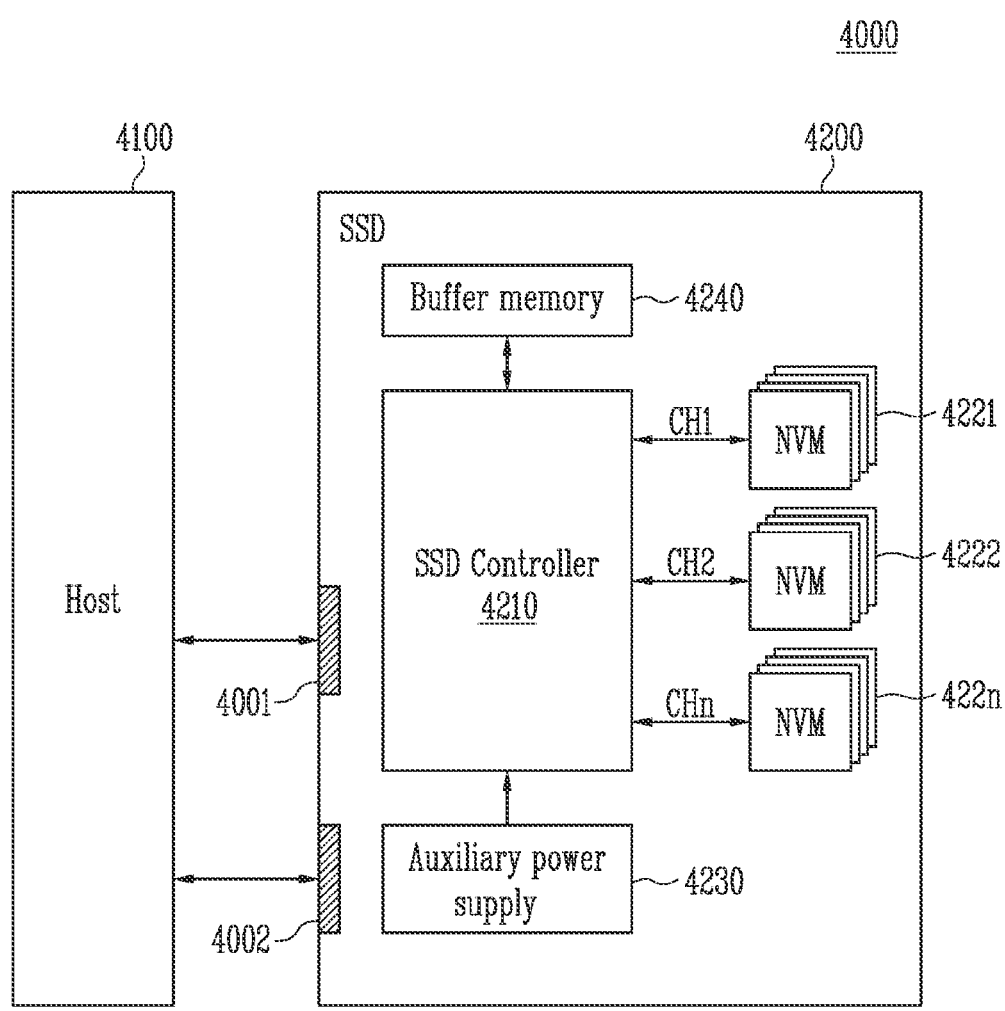
FIG. 11 is a diagram illustrating a solid state drive (SSD) system according to an embodiment of the present disclosure.

FIG. 11 is a diagram illustrating a solid state drive (SSD) system according to an embodiment of the present disclosure.

Referring to FIG. 11, an SSD system 4000 may include a host 4100 and an SSD 4200, The SSD 4200 may exchange a signal SIG with the host 4100 through a signal connector 4001, and may be supplied with power PWR through a power connector 4002. The SSD 4200 may include an SSD controller 4210, a plurality of flash memories 4221 to 422n, an auxiliary power supply 4230, and a buffer memory 4240.

In an embodiment, the SSD controller 4210 may perform a function of the memory controller 200, described above with reference to FIG. 1, The SSD controller 4210 may control the plurality of flash memories 4221 to 422n in response to the signal SIG received from the host 4100. In an embodiment, the signal SIG may indicate signals based on the interfaces of the host 4100 and the SSD 4200. For example, the signal SIG may be a signal defined by at least one of various interfaces such as universal serial bus (USB), multimedia card (MMC), embedded MMC (eMMC), peripheral component interconnection (PCI), PCI-express (PCI-E), an advanced technology attachment (ATA), serial-ATA (SATA), parallel-ATA (DATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 4230 may be coupled to the host 4100 through the power connector 4002. The auxiliary power supply 4230 may be supplied with power PWR from the host 4100, and may be charged. The auxiliary power supply 4230 may supply the power of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located in a main board, and may also provide auxiliary power to the SSD 4200.

The buffer memory 4240 may function as a buffer memory of the SSD 4200. For example, the buffer memory 4240 may temporarily store data received from the host 4100 or data received from the plurality of flash memories 4221 to 422n, or may temporarily store metadata (e.g., mapping tables) of the flash memories 4221 to 422n. The buffer memory 4240 may include volatile memories, such as DRAM, SDRAM, DDR SDRAM, LPDDR SDRAM, and GRAM, or nonvolatile memories, such as FRAM, ReRAM, STT-MRAM, and PRAM, FIG. 12 is a diagram illustrating a user system according to an embodiment of the present disclosure.

Figure 12:
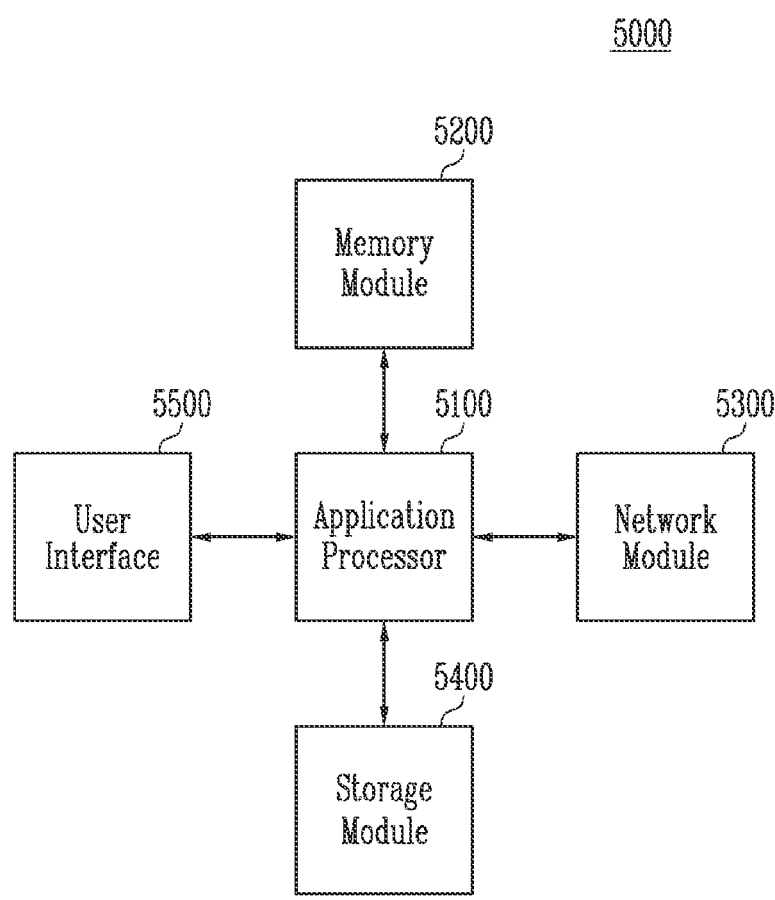
FIG. 12 is a diagram illustrating a user system according to an embodiment of the present disclosure.

Referring to FIG. 12, a user system 5000 may include an application processor 5100, a memory module 5200, a network module 5300, a storage module 5400, and a user interface 5500.

The application processor 5100 may execute components included in the user system 5000, an operating system (OS), a user program or the like. In an embodiment, the application processor 5100 may include controllers, interfaces, graphic engines, etc. for controlling the components included in the user system 5000. The application processor 5100 may be provided in the form of a system-on-chip (SoC).

The memory module 5200 may function as a main memory, a working memory, a buffer memory or a cache memory of the user system 5000. The memory module 5200 may include volatile RAMs such as DRAM, SDRAM, DDR SDRAM, DDR2 SDRAM, DDR3 SDRAM, LPDDR SDARM, LPDDR2 SDRAM, and LPDDR3 SDRAM or nonvolatile RAMs such as PRAM, ReRAM, MRAM, and FRAM. In an embodiment, the application processor 5100 and the memory module 5200 may be packaged based on a package-on-package (POP), and may then be provided as a single semiconductor package.

The network module 5300 may communicate with external devices. In an embodiment, the network module 5300 may support wireless communication, such as code division multiple access (CDMA), global system for mobile communication (GSM), wideband CDMA (WCDMA), CDMA-2000, time division multiple access (TDMA), long term evolution (LTE), Wimax, wireless LAN (MILAN), UWB, Bluetooth, or WiFi. In an embodiment, the network module 5300 may be included in the application processor 5100.

The storage module 5400 may store data. For example, the storage module 5400 may store data received from the application processor 5100. Alternatively, the storage module 5400 may transmit the data stored in the storage module 5400 to the application processor 5100. In an embodiment, the storage module 5400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 5400 may be provided as a removable storage medium (removable drive), such as a memory card or an external drive of the user system 5000.

In an embodiment, the storage module 5400 may include a plurality of nonvolatile memory devices, each of which may be operated in the same manner as the memory device, described above with reference to FIGS. 1 to 3. The storage module 5400 may be operated in the same manner as the storage device 1000, described above with reference to FIG. 1.

The user interface 5500 may include interfaces which input data or instructions to the application processor 5100 or output data to an external device. In an embodiment, the user interface 5500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 5500 may include user output interfaces such as an a liquid crystal display (LCD), an organic light-emitting diode (OLED) display device, an active matrix OLED (AMOLED) display device, an LED, a speaker, and a monitor.

In accordance with an embodiment, there are provided a memory device that supports an improved program operation and a method of operating the memory device.

What is claimed is:

1. A memory device, comprising:
   a memory cell array including a plurality of memory cells;
   a peripheral circuit configured to perform a program operation including a plurality of program loops for storing data in selected memory cells among the plurality of memory cells; and
   a control logic circuit configured to control the peripheral circuit to perform a program verify operation including one of a main verify operation and a pre-verify operation, the program verify operation verifying whether the selected memory cells form threshold voltage distributions corresponding to target program states corresponding to the data to be stored in the selected memory cells, respectively,
   wherein the control logic circuit, when the pre-verify operation for any one of the target program states has passed in any one of the plurality of program loops has passed, controls the peripheral circuit to perform the main verify operation for the any one of the target program states of the selected memory cells in a next program loop of the any one of the plurality of program loops.

2. The memory device according to claim 1, wherein the control logic circuit, when the pre-verify operation for the any one of the target program states has passed in the any one of the plurality of program loops has passed, controls the peripheral circuit to skip the pre-verify operation for the any one of the target program states in the next program loop.

3. The memory device according to claim 1, wherein the pre-verify operation is determined to have failed when a number of memory cells having threshold voltages lower than a pre-verify voltage is greater than a reference number of memory cells.

4. The memory device according to claim 1, wherein the main verify operation is determined to have failed when a number of memory cells having threshold voltages lower than a main verify voltage is greater than a reference number of memory cells.

5. The memory device according to claim 4, wherein the main verify voltage has a potential level higher than a potential level of a pre-verify voltage.

6. The memory device according to claim 1, wherein the control logic circuit comprises:
   a program loop manager configured to generate pre-pass information related to a program loop in which the pre-verify operation has passed and main pass information related to a program loop in which the main verify operation has passed.

7. The memory device according to claim 6, wherein the control logic circuit controls a subsequent program operation on memory cells to be programmed after the selected memory cells, based on the pre-pass information and the main pass information.

8. The memory device according to claim 1, wherein the program operation is an incremental step pulse programming operation in which a program voltage to be applied is increased by a step voltage as the plurality of program loops are sequentially performed.

9. The memory device according to claim 1, wherein the control logic circuit comprises:
   a program voltage controller configured to control the peripheral circuit to apply a program voltage to a word line coupled to the selected memory cells; and
   a verify operation controller configured to control the peripheral circuit to apply a main verify voltage for the main verify operation or a pre-verify voltage for the pre-verify operation to the word line coupled to the selected memory cells.

10. The memory device according to claim 1, wherein the peripheral circuit comprises:
    a voltage generator configured to generate internal voltages including a program voltage, a main verify voltage, and a pre-verify voltage that are applied during the program operation.

11. A memory device, comprising:
    a memory cell array including a plurality of memory cells;
    a peripheral circuit configured to perform a program operation including a plurality of program loops for storing data in selected memory cells among the plurality of memory cells; and
    a control logic circuit configured to control the peripheral circuit to perform a program verify operation including a main verify operation and a pre-verify operation, the program verify operation verifying whether the selected memory cells form threshold voltage distributions corresponding to target program states corresponding to the data to be stored in the selected memory cells, respectively,
    wherein the control logic circuit, when the pre-verify operation for any one of the target program states of the selected memory cells in any one of the plurality of program loops has passed, controls the peripheral circuit to skip the pre-verify operation for the any one of the target program states in next program loop of the any one of the plurality of program loops.

12. The memory device according to claim 11, wherein the control logic circuit, when the pre-verify operation for the any one of the target program states has passed, controls the peripheral circuit to perform only the main verify operation for the any one of the target program states.

13. The memory device according to claim 11, wherein the pre-verify operation is determined to have failed when a number of memory cells having threshold voltages lower than a pre-verify voltage is greater than a reference number of memory cells.

14. The memory device according to claim 11, wherein the main verify operation is determined to have failed when a number of memory cells having threshold voltages lower than a main verify voltage is greater than a reference number of memory cells.

15. The memory device according to claim 14, wherein the main verify operation uses the main verify voltage having a potential level higher than a potential level of a pre-verify voltage for the pre-verify operation.

16. The memory device according to claim 11, wherein the control logic circuit comprises:
    a program loop manager configured to generate pre-pass information related to a program loop in which the pre-verify operation has passed and main pass information related to a program loop in which the main verify operation has passed.

17. The memory device according to claim 16, wherein the control logic circuit controls a subsequent program operation on memory cells to be programmed after the selected memory cells, based on the pre-pass information and the main pass information.

18. The memory device according to claim 11, wherein the program operation is an incremental step pulse programming operation in which a program voltage to be applied is increased by a step voltage as the plurality of program loops are sequentially performed.

19. The memory device according to claim 11, wherein the control logic circuit comprises:
    a program voltage controller configured to control the peripheral circuit to apply a program voltage to a word line coupled to the selected memory cells; and
    a verify operation controller configured to control the peripheral circuit to apply a main verify voltage for the main verify operation and a pre-verify voltage for the pre-verify operation to the word line coupled to the selected memory cells.

20. The memory device according to claim 11, wherein the peripheral circuit comprises:
    a voltage generator configured to generate internal voltages including a program voltage, a main verify voltage, and a pre-verify voltage that are applied during the program operation.

* * * * *